United States Patent
Yu et al.

(10) Patent No.: US 10,727,064 B2
(45) Date of Patent: *Jul. 28, 2020

(54) POST UV CURE FOR GAPFILL IMPROVEMENT

(71) Applicant: Taiwan Semiconductor Manufacturing Co., Ltd., Hsinchu (TW)

(72) Inventors: De-Wei Yu, Ping-tung (TW); Chien-Hao Chen, Chuangwei Township (TW); Chih-Tang Peng, Zhubei (TW); Jei Ming Chen, Tainan (TW); Shu-Yi Wang, Taichung (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/450,460

(22) Filed: Jun. 24, 2019

(65) Prior Publication Data

US 2019/0318932 A1 Oct. 17, 2019

Related U.S. Application Data

(63) Continuation of application No. 15/920,753, filed on Mar. 14, 2018, now Pat. No. 10,332,746.

(51) Int. Cl.
| | |
|---|---|
| *H01L 21/02* | (2006.01) |
| *H01L 21/28* | (2006.01) |
| *H01L 29/66* | (2006.01) |
| *H01L 21/3213* | (2006.01) |
| *H01L 21/3205* | (2006.01) |

(Continued)

(52) U.S. Cl.
CPC .... *H01L 21/28035* (2013.01); *H01L 21/0262* (2013.01); *H01L 21/02348* (2013.01); *H01L 21/02532* (2013.01); *H01L 21/32055* (2013.01); *H01L 21/32137* (2013.01); *H01L 21/823431* (2013.01); *H01L 29/66545* (2013.01); *H01L 29/66795* (2013.01); *H01L 29/785* (2013.01);
(Continued)

(58) Field of Classification Search
CPC ......... H01L 21/02348; H01L 21/02532; H01L 21/02667; H01L 21/32055; H01L 21/823431; H01L 29/1604; H01L 29/66545; H01L 29/66795; H01L 29/785; H01L 29/7851
See application file for complete search history.

(56) References Cited

U.S. PATENT DOCUMENTS

| | | | |
|---|---|---|---|
| 8,470,678 B2 | 6/2013 | Cai et al. | |
| 10,332,746 B1 * | 6/2019 | Yu | ..... H01L 29/66795 |

(Continued)

*Primary Examiner* — Stephen W Smoot
(74) *Attorney, Agent, or Firm* — Slater Matsil, LLP

(57) ABSTRACT

Embodiments disclosed herein relate generally to forming a gate layer in high aspect ratio trenches using a cyclic deposition-etch process. In an embodiment, a method for semiconductor processing is provided. The method includes performing a first deposition process to form a conformal film over a bottom surface and along sidewall surfaces of a feature on a substrate. The method includes performing an etch process to remove a portion of the conformal film. The method includes repeating the first deposition process and the etch process to fill the feature with the conformal film. The method includes exposing the conformal film to ultraviolet light.

20 Claims, 13 Drawing Sheets

(51) Int. Cl.
  *H01L 21/8234* (2006.01)
  *H01L 29/78* (2006.01)
(52) U.S. Cl.
  CPC .... *H01L 21/0243* (2013.01); *H01L 21/02488* (2013.01)

(56) References Cited

U.S. PATENT DOCUMENTS

| | | |
|---|---|---|
| 2007/0066022 A1 | 3/2007 | Chen et al. |
| 2008/0093709 A1 | 4/2008 | Matsuura et al. |
| 2009/0061647 A1* | 3/2009 | Mallick ............ H01L 21/02126 438/773 |
| 2009/0294927 A1 | 12/2009 | Lu et al. |
| 2011/0151678 A1* | 6/2011 | Ashtiani ........... H01L 21/76224 438/786 |
| 2016/0351686 A1 | 12/2016 | Han et al. |
| 2018/0096898 A1 | 4/2018 | Yu et al. |
| 2018/0151693 A1 | 5/2018 | Li et al. |
| 2018/0350693 A1 | 12/2018 | Huang et al. |
| 2019/0006228 A1 | 1/2019 | Huang et al. |
| 2019/0080919 A1 | 3/2019 | Tapily |

\* cited by examiner

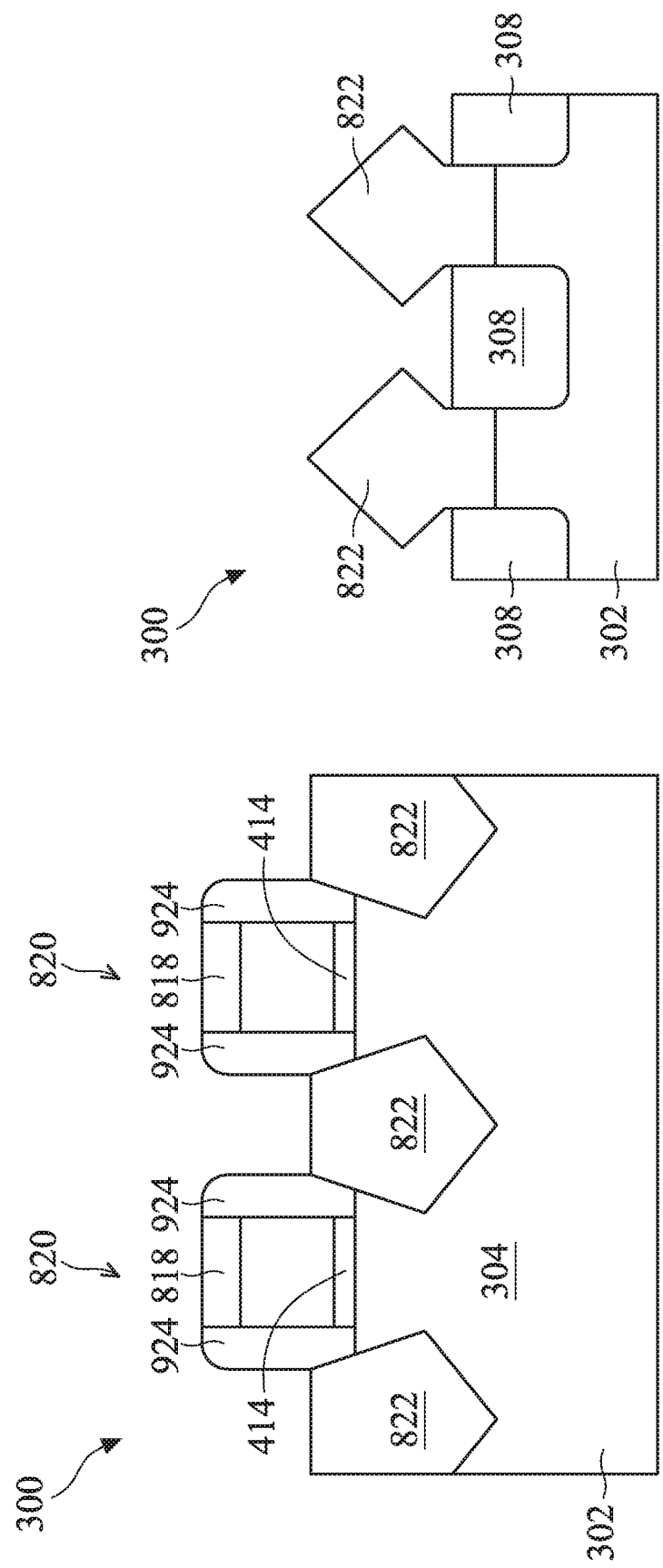

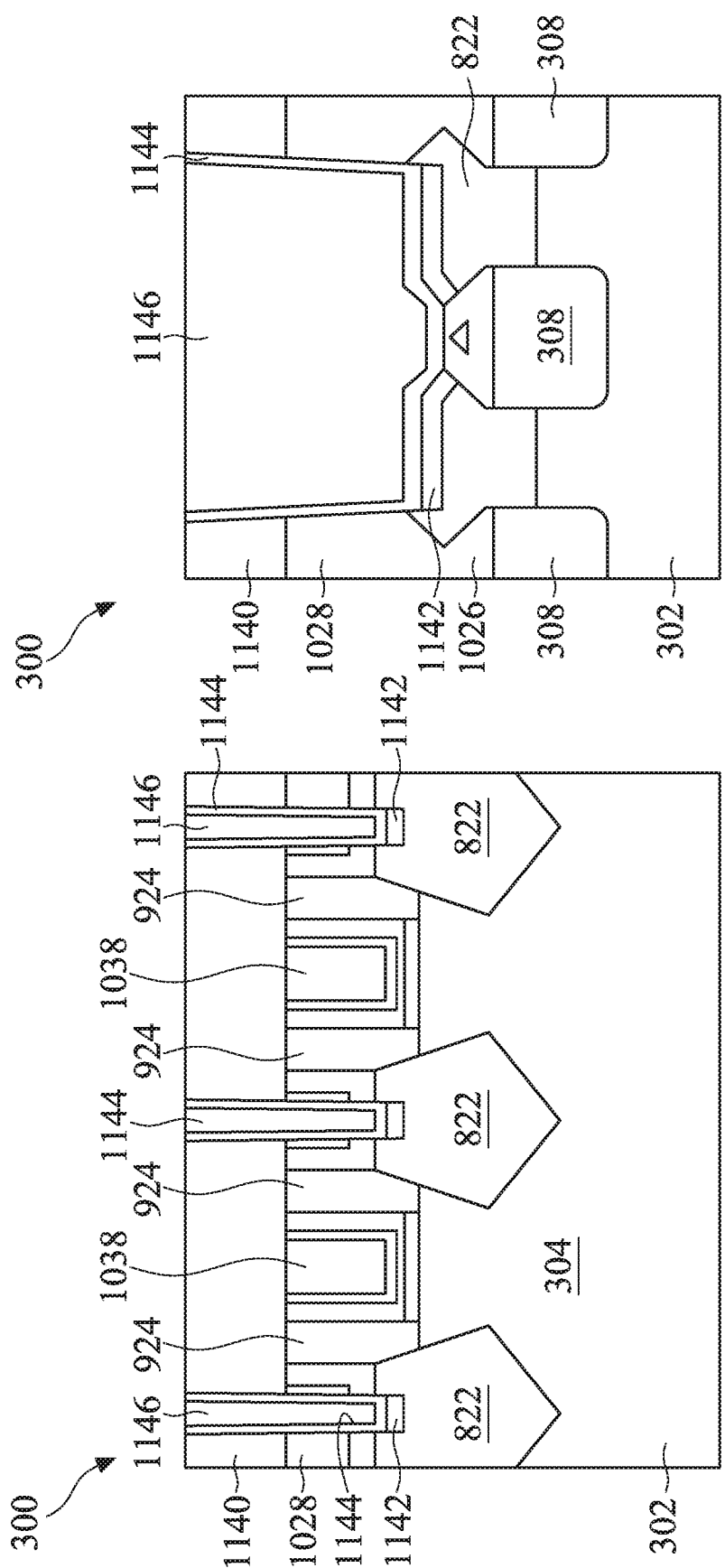

POST UV CURE FOR GAPFILL IMPROVEMENT

PRIORITY CLAIM AND CROSS-REFERENCE

This application is a continuation of U.S. patent application Ser. No. 15/920,753, entitled "Post UV Cure For Gapfill Improvement," filed on Mar. 14, 2018, now U.S. Pat. No. 10,332,746 issued Jun. 25, 2019, which application is incorporated herein by reference.

BACKGROUND

As the semiconductor industry has progressed into nanometer technology process nodes in pursuit of higher device density, higher performance, and lower costs, challenges from both fabrication and design issues have resulted in the development of three-dimensional designs, such as a Fin Field Effect Transistor (FinFET). FinFET devices typically include semiconductor fins with high aspect ratios and in which channel and source/drain regions are formed. A gate is formed over and along the sides of the fin structure (e.g., wrapping) utilizing the advantage of the increased surface area of the channel to produce faster, more reliable, and better-controlled semiconductor transistor devices. With the decreasing in scaling, however, it has been challenging to deposit a film in high aspect ratio trenches with small dimension without being presented problems.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3 through 6, 7A-7B, 8A-8C, 9A-9B, 10A-10B, and 11A-11B illustrate various schematic three-dimensional and cross-sectional views of an example semiconductor device structure corresponding to various stages of fabrication according to some embodiments.

DETAILED DESCRIPTION

Figure 1:
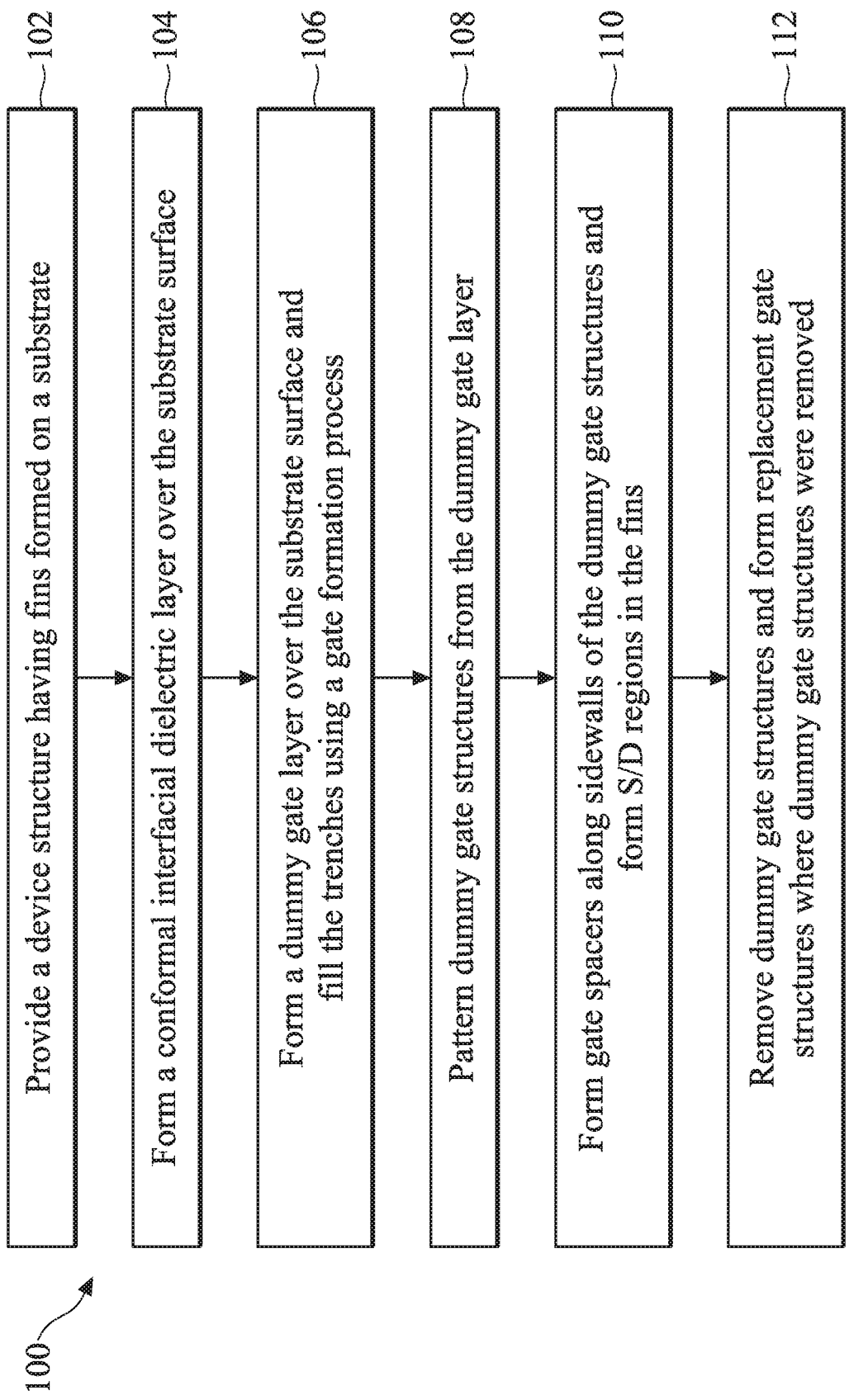
FIG. 1 is a flow chart illustrating an example method for fabricating a semiconductor device structure according to some embodiments.

The following disclosure provides many different embodiments, for examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments described herein relate to depositing a film or layer in semiconductor processing. Embodiments specifically described herein are in the context of depositing a film or layer in trenches between fins, which trenches can be a high aspect ratio. A cyclic deposition-etching process can include depositing a portion of the film or layer, etching a portion of the film, and repeating the depositing and etching any number of times. After any number of cycles of the cyclic deposition-etching process, an ultraviolet (UV) cure process can be performed on the deposited layer. The UV cure process can reduce or eliminate voids or seams in the film or layer in the trench. Aspects of examples described herein can be applied to depositing a film or layer in any trench or recess, which may have a high aspect ratio.

Figure 2:
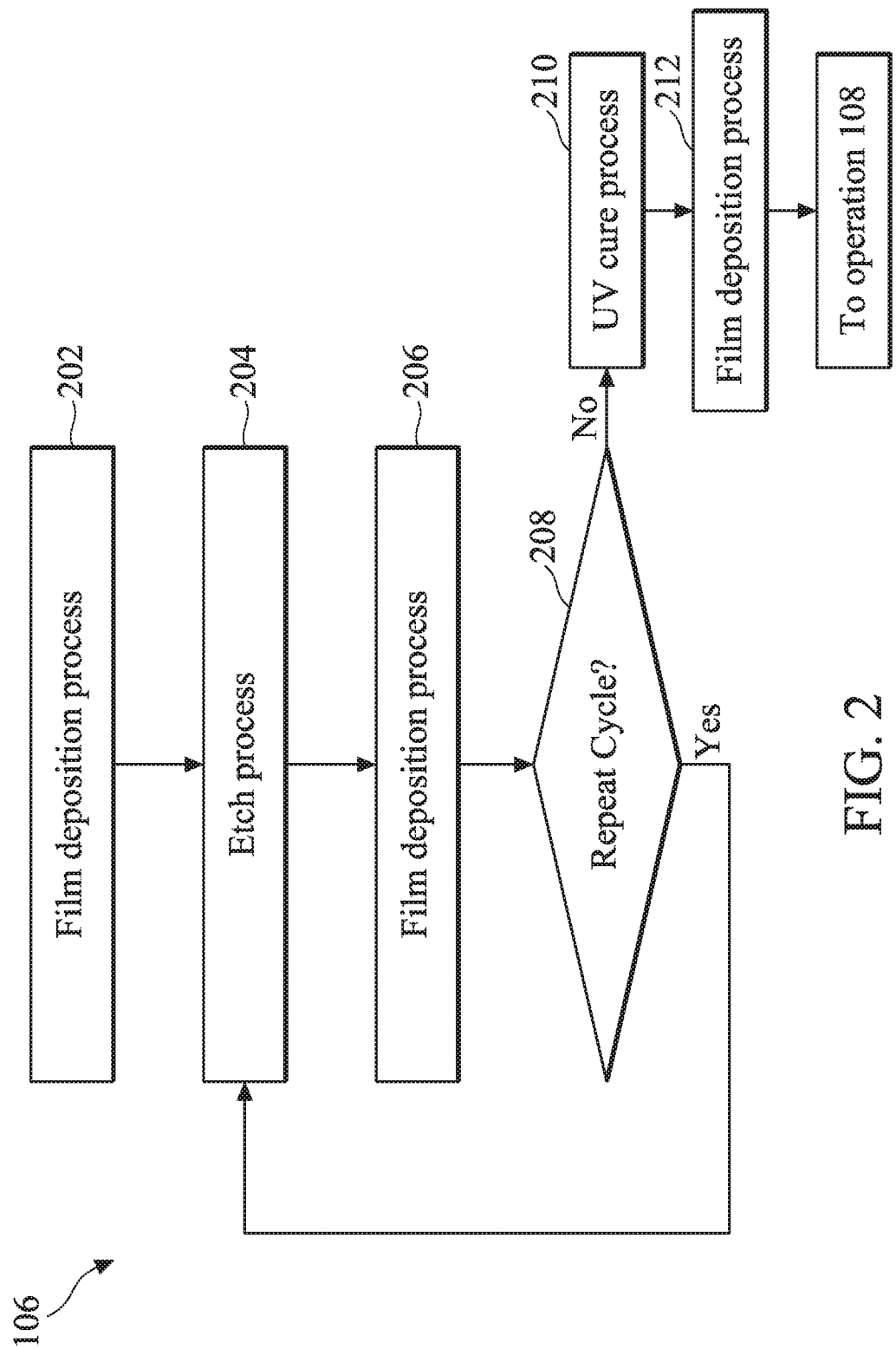
FIG. 2 illustrates an example dummy gate layer formation process according to some embodiments.

FIG. 1 is a flow chart 100 illustrating an exemplary method for fabricating a semiconductor device structure 300 according to some embodiments. FIG. 2 illustrates an example dummy gate layer formation process 106 that can be used during operation of the flow chart 100 of FIG. 1 according to some embodiments. FIGS. 3 through 11B are schematic three-dimensional and cross-sectional views of a portion of the semiconductor device structure 300 corresponding to various stages of fabrication according to the flow chart of FIG. 1 in accordance with some embodiments. It is noted that the flow chart 100 may be utilized to form any other semiconductor structures not presented herein. Those skilled in the art should recognize that a full process for forming a semiconductor device and the associated structures are not illustrated in the drawings or described herein. Although various operations are illustrated in the drawings and described herein, no limitation regarding the order of such steps or the presence or absence of intervening steps is implied. Operations depicted or described as sequential are, unless explicitly specified, merely done so for purposes of explanation without precluding the possibility that the respective steps are actually performed in concurrent or overlapping manner, at least partially, if not entirely.

Figure 3:
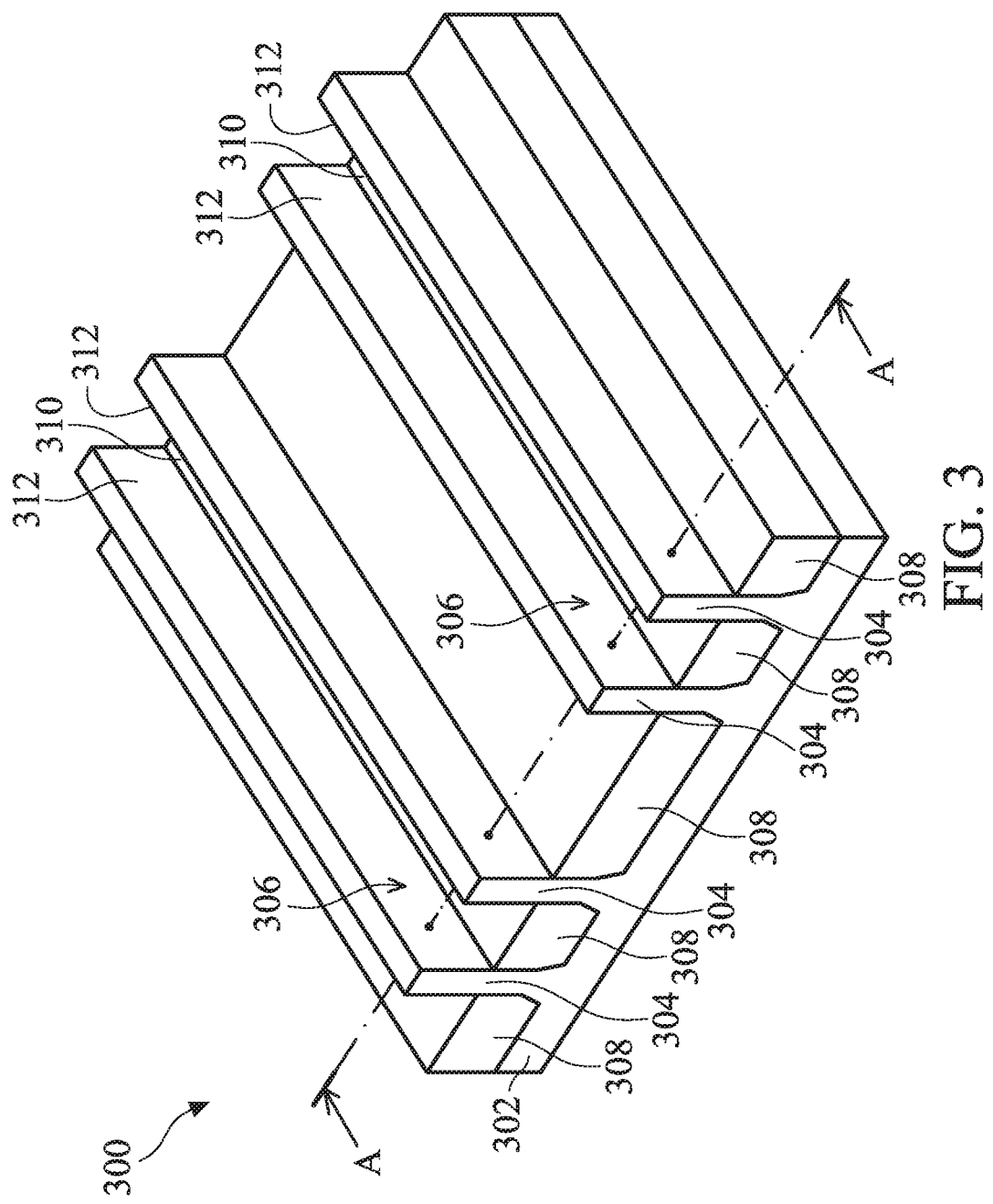

The flow chart 100 begins at operation 102, and further with reference to FIG. 3, by providing a semiconductor device structure 300. The semiconductor device structure 300 has fins 304 formed on a semiconductor substrate 302. The semiconductor substrate 302 may be or include a bulk semiconductor substrate, a semiconductor-on-insulator (SOI) substrate, or the like, which may be doped (e.g., with a p-type or an n-type dopant) or undoped. In some embodiments, the semiconductor material of the semiconductor substrate 302 may include an elemental semiconductor including silicon (Si) or germanium (Ge); a compound semiconductor; an alloy semiconductor; or a combination thereof. Each fin 304 provides an active area where one or more devices are to be formed. The fins 304 are fabricated using suitable processes performed on the semiconductor substrate 302, including masking, photolithography, and/or etch processes, to form trenches 306 in the substrate 302, leaving the fins 304 extended upwardly from the substrate 302. The trenches 306 may then be filled with an insulating material. The insulating material may be any suitable dielectric such as an oxide (e.g., silicon oxide), a nitride, the like, or a combination thereof. The insulating material is then recessed, such as by using an acceptable etch process, to form isolation regions 308. The insulating material is recessed such that the top portion of the fins 304 is exposed. The fins 304 protrude above and from between neighboring isolation regions 308.

FIG. 3 further illustrates a cross-section A-A. FIGS. 4 through 7A illustrate cross-sections of the semiconductor device structure 300 corresponding to the cross-section A-A at various stages of fabrication.

Figure 4:
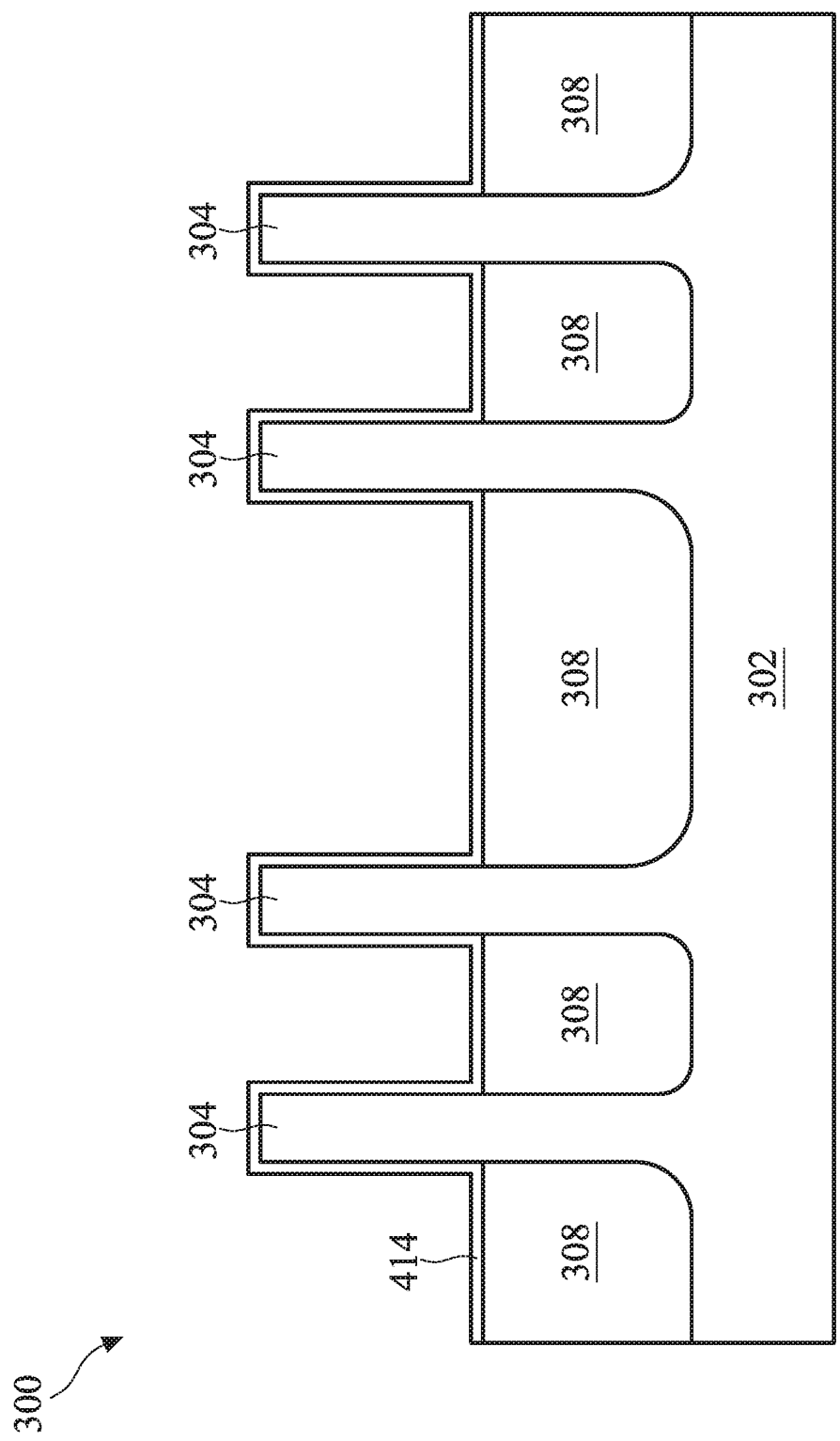

At operation 104, and further with reference to FIG. 4, an interfacial dielectric layer 414 is conformally formed over the substrate 302 to cover the fins 304 and the exposed surfaces of the isolation regions 308. The interfacial dielectric layer 414 may include or be silicon oxide, silicon nitride, the like, or multilayers thereof, and may be thermally and/or chemically grown on the fins 304, or conformally deposited, such as by plasma enhanced chemical vapor deposition (PECVD), atomic layer deposition (ALD), or any suitable deposition technique. In some embodiments, and further at operation 104, a seed layer (not shown) may be conformally formed on the interfacial dielectric layer 414. The seed layer can be formed on the interfacial dielectric layer 414 to help uniform growth of the subsequent dummy gate layer on the fins 304 and the isolation regions 308. The seed layer may be chosen depending on the material of the subsequent dummy gate layer. In some embodiments where the subsequent dummy gate layer includes silicon (e.g., polysilicon or amorphous silicon), the seed layer may be a silicon-containing film. In such a case, the seed layer can be formed by exposing the substrate surface to a silicon-containing compound to form a solid thin film layer containing silicon on the interfacial dielectric layer 414. The term "substrate surface" in this disclosure is intended to include the exposed surface of a film/layer or partial film/layer that has been deposited onto a substrate, such as the substrate 302, and the exposed surface of the newly deposited film/layer can also become the substrate surface prior to any subsequent process(es). The seed layer may be formed by ALD, chemical vapor deposition (CVD), or any suitable deposition technique. In some embodiments, the seed layer is a silicon layer formed by ALD. Suitable silicon-containing compounds may include, but are not limited to, $(SiH_3)_3N$, $Si[N(CH_3)_2]_4$, $SiH[N(CH_3)_2]_3$, $SiH_2[N(CH_3)_2]_2$, $SiH_3[N(CH_3)_2]$, $SiH_3[N((CH—(CH_3)_2)_2]$, the like, or combinations thereof. In some embodiments, the seed layer is formed using $SiH_3[N((CH—(CH_3)_2)_2]$.

After operation 104, a dummy gate layer is formed over the substrate surface (e.g., over the interfacial dielectric layer 414 and/or the seed layer if used) and fills the trenches 306. Each of the trenches 306 has a bottom surface 310 (e.g., top surface of the isolation region 308) and sidewall surfaces 312 extending upwardly from the bottom surface 310. In various embodiments, the trenches 306 may have an aspect ratio of about 3:1 to about 30:1, such as about 5:1 to about 20:1, for example about 8:1 to about 10:1. The term "aspect ratio" refers to the ratio of the height dimension to the width dimension of a particular feature, for example, trench height/trench width. The trench height substantially equals to the height of the fins 304 protruding above the isolation regions 308 while the trench width substantially equals to the width or distance of the isolation region 308 between two neighboring fins 304.

The film can be any suitable film, such as a film for forming a dummy gate layer. In some embodiments, the film formed is an amorphous silicon (a-Si) film. For replacement gate processes, the dummy gate layer may be formed of poly-silicon or amorphous silicon.

A dummy gate layer formation process described herein may deposit a film in high aspect ratio trenches without forming (e.g., by reducing or eliminating) a seam or void. Particularly, the dummy gate formation process can be used to fill features with any suitable aspect ratio (ratio of the depth of the feature to the width of the feature), such as a feature with an aspect ratio equal or greater than 5:1, 10:1, 20:1, 25:1, 30:1, 35:1, 40:1, 50:1, or 100:1. As described in more detail herein, various embodiments of the dummy gate layer formation process include a cyclic process for depositing and etching a film in high aspect ratio trenches defined between neighboring fins 304 and curing the film with exposure to ultraviolet (UV) light in order to break Si—H bonds in the film and create dangling bonds. The UV cure then reconstructs Si—Si bonds from the dangling bonds, which can densify the film and can reduce or eliminate seams and voids.

At operation 106, a dummy gate layer formation process is performed to deposit a dummy gate layer over the substrate surface (e.g., exposed surfaces of the interfacial dielectric layer 414 (or the seed layer if used) and fill the trenches 306. FIG. 2 illustrates an example dummy gate layer formation process 106 that can be used during the operation 106 according to some embodiments, and FIGS. 5 to 7A-7B are schematic cross-sectional views of a portion of the semiconductor device structure 300 corresponding to various stages of trench filling according to the flow chart of FIG. 2. The dummy gate layer formation process 106 generally includes a film deposition process 202, an etching process 204, a film deposition process 206, a UV cure process 210, and a film deposition process 212. A purge gas such as an inert gas may be flowed into the processing chamber (in which the semiconductor device structure 300 is disposed) between the various deposition, etch, and UV cure processes 202, 204, 206, 210, 212. For example, the dummy gate layer formation process 106 may include cycles of the film deposition process 202, followed by a chamber purge, followed by the etching process 204, followed by a chamber purge, followed by the film deposition process 206, and followed by a chamber purge. The inert gas may be any suitable inert gas such as argon, helium, neon, or any combination thereof.

The film deposition processes 202, 206, 212 and the etching process 204 may be performed in the same or different processing chamber. The deposition-etch processes 204, 206 can be repeated sequentially and/or alternatingly to gradually fill the trenches 306. After a pre-determined number of cycles of the deposition-etch processes 204, 206, the film formed can fill the trenches, such as the trenches 306 from bottom surface 310 to tops of the fins 304. This cyclic deposition-etch processes 204, 206 can be repeated until trench fill is achieved, as determined at operation 208, or a desired height of the dummy gate layer is achieved. Thereafter, the dummy gate layer formation process 106 may proceed to the UV cure process 210, another film deposition process 212, and then to operation 108.

Figure 5:
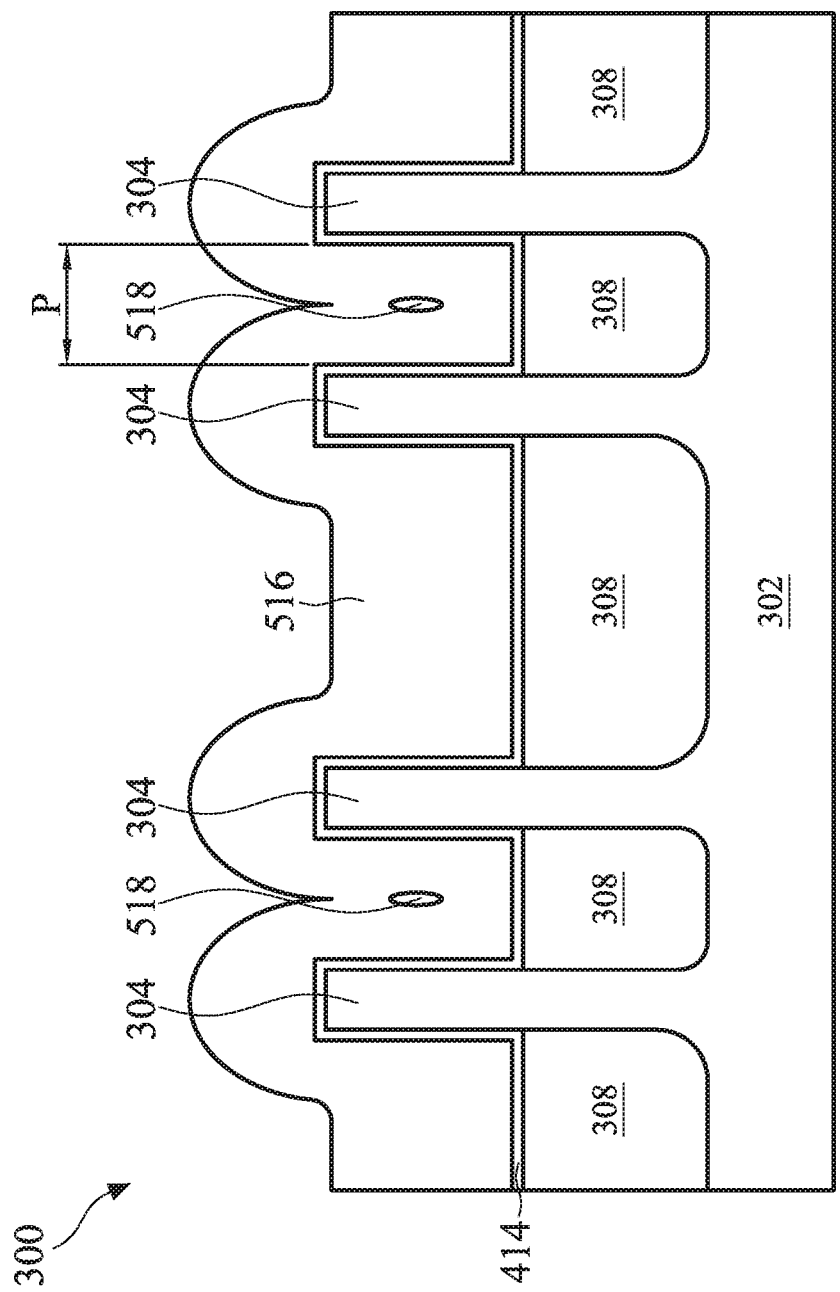

The film deposition process 202 includes depositing at least a portion of a film 516 over the substrate surface, as shown in FIG. 5. In some embodiments, the substrate surface may include exposed surfaces of the interfacial dielectric layer 414 that is conformally formed on fins 304 and the upper surfaces of the isolation regions 308. In some embodiments, the substrate surface may include an exposed surface of the seed layer (if present) that is conformally formed on the interfacial dielectric layer 414. In various embodiments, the film 516 formed by the film deposition process 202 may include or be any material suitable for a dummy gate layer. Suitable material for the film 516 may include amorphous silicon (a-Si) or polysilicon. In an example, the film 516 formed by the film deposition process 202 is amorphous silicon. The film deposition process 202 can be any suitable deposition process including, but is not limited to, low-pressure CVD (LPCVD), CVD, PECVD, ALD, plasma-enhanced ALD (PEALD), or any suitable deposition technique. In some embodiments, the film deposition process 202 is performed using LPCVD. LPCVD may be advantageous in some applications since it can deposit a wide range of film compositions with good conformal step coverage.

The film 516 may be formed by exposing the substrate surface to a silicon-containing precursor. Suitable silicon-containing precursors may include silanes, halogenated silanes, or any combinations thereof. Silanes may include silane ($SiH_4$) and higher silanes with the empirical formula $Si_xH_{(2x+2)}$, such as disilane ($Si_2H_6$), trisilane ($Si_3H_8$), and tetrasilane ($Si_4H_{10}$). Halogenated silanes may include, but are not limited to, a chlorinated silane, such as monochlorosilane ($SiH_3Cl$, MCS), dichlorosilane ($Si_2H_2Cl_2$, DCS), trichlorosilane ($SiHCl_3$, TCS), hexachlorodisilane ($Si_2Cl_6$, HCDS), octachlorotrisilane ($Si_3Cl_8$, OCTS), or silicon tetrachloride (STC). In some embodiments, the silicon-containing precursor may use organosilanes which may include compounds with the empirical formula $R_ySi_xH_{(2+2-y)}$, where R is independently methyl, ethyl, propyl, or butyl, such as methylsilane (($CH_3$)$SiH_3$), dimethylsilane (($CH_3$)$_2SiH_2$), ethylsilane (($CH_3CH_2$)$SiH_3$), methyldisilane (($CH_3$)$Si_2H_5$), dimethyldisilane (($CH_3$)$_2Si_2H_4$), hexamethyldisilane (($CH_3$)$_6$ $Si_2$), tris(dimethylamino)silane (TDMAS), and any combination thereof. In some cases, the silicon-containing precursor may be carbon-free.

Example film deposition process 202 may involve using a LPCVD reactor to process a batch of wafers, such as the semiconductor device structure 300. The wafers can be stacked side by side and placed in a boat or cage held in the LPCVD reactor. The reactor of the LPCVD is heated and maintained by heating elements of the LPCVD reactor at a temperature in a range from about 120° C. to about 550° C. A silicon-containing precursor, such as $SiH_4$, $Si_2H_6$, $Si_2H_2Cl_2$, $SiHCl_3$, $Si_2Cl_6$, or any combination thereof, may be introduced into the LPCVD reactor from a gas injector. In some examples, the silicon-containing precursor includes $SiH_4$ and $Si_2H_6$. In some examples, the silicon-containing precursor is flowed at a rate less than or equal to about 2 standard liters per minute (sLm). The pressure inside the reactor can be maintained at pressure less than or equal to about 1 Torr. The film deposition process 202 forms the film, e.g., a-Si, over the substrate surface with a thickness in a range from about 10 Angstroms to about 100 Angstroms.

While the dummy gate layer material using silicon is discussed, the concept described herein is equally applicable to other materials such as silicon germanium ($Si_xGe_{1-x}$, where x can be between approximately 0 and 1), silicon carbide, silicon phosphorus, silicon carbon phosphorus, germanium, a III-V compound semiconductor, a II-VI compound semiconductor, or the like. In cases where silicon germanium is implemented, a germanium-containing precursor (e.g., $GeH_4$, $Ge_2H_6$, etc.) or a halogenated germanium precursor (e.g., $GeCl_4$, $GeHCl_3$, $Ge_2Cl_6$, $Ge_3Cl_6$, etc.) may be used in conjunction with any of the silicon-containing precursors discussed above to fill the trenches, such as the trenches 306.

After the film deposition process 202, the dummy gate layer formation process 106 continues to the etching process 204. The etching process 204 can be performed in situ in the reactor of the LPCVD. A purge can be performed following the film deposition process 202 and before the etching process 204. During the etching process 204, the reactor of the LPCVD can be maintained at a temperature in a range from about 120° C. to about 550° C. An etchant gas (e.g. a halogen-containing precursor), such as $Cl_2$, HCl, $F_2$, or any combination thereof, may be introduced into the LPCVD reactor from a gas injector. In some examples, the etchant gas includes $Cl_2$. In some examples, the etchant gas is flowed at a rate in a range from about 100 sccm to about 10000 sccm. The pressure inside the reactor can be maintained at pressure less than or equal to about 4.5 Torr. The etching process 204 may remove portions of the deposited film 516 at upper portions of trenches, such as high aspect ratio trenches. By removing these portions of the deposited film 516, the film 516 may be prevented from being pinched-off or closed at the upper portions of the trenches before the respective trench is filled.

After the etching process 204, the dummy gate layer formation process 106 proceeds to the film deposition process 206. The film deposition process 206 can be performed in situ in the reactor of the LPCVD. A purge can be performed following the etching process 204 and before the film deposition process 206. The film deposition process 206 can be identical to the film deposition process 202 as discussed above.

In some embodiments, the etching process 204 and film deposition process 206 may repeat any number of cycles. After the film deposition process 206, the dummy gate layer formation process 106 proceeds to operation 208 to determine whether another cycle should be repeated. If another cycle is to be repeated, the dummy gate layer formation process 106 proceeds to perform the etching process 204 and the film deposition process 206 as discussed above. If another cycle is not to be repeated, the dummy gate layer formation process 106 proceeds to the UV cure process 210.

In some examples, cycles can be repeated until at least some of the trenches 306 (e.g., high aspect ratio trenches) between fins 304 are filled with the film 516. For example, the cycles can be repeated until the thickness of the film 516 exceeds half a pitch P between neighboring fins 304, e.g., that define a high aspect ratio trench. Hence, the film 516 can have lateral growth fronts in a trench (e.g., proceeding laterally from sidewalls of respective fins 304) that merge together. The merging of the lateral growth fronts can create seams and/or voids 518 in the film 516 between neighboring fins 304, as shown in FIG. 5. Some embodiments can have different pitches between fins 304, and the thickness of the film 516 may correspond to any of the pitches.

In some examples, the formation of the film 516 by processes 202, 204, 206 may result in deformation of one or more of the fins 304. The film 516 can be formed by processes 202, 204, 206 with a high stress, which can cause, e.g., bending of the fins 304.

Figure 6:
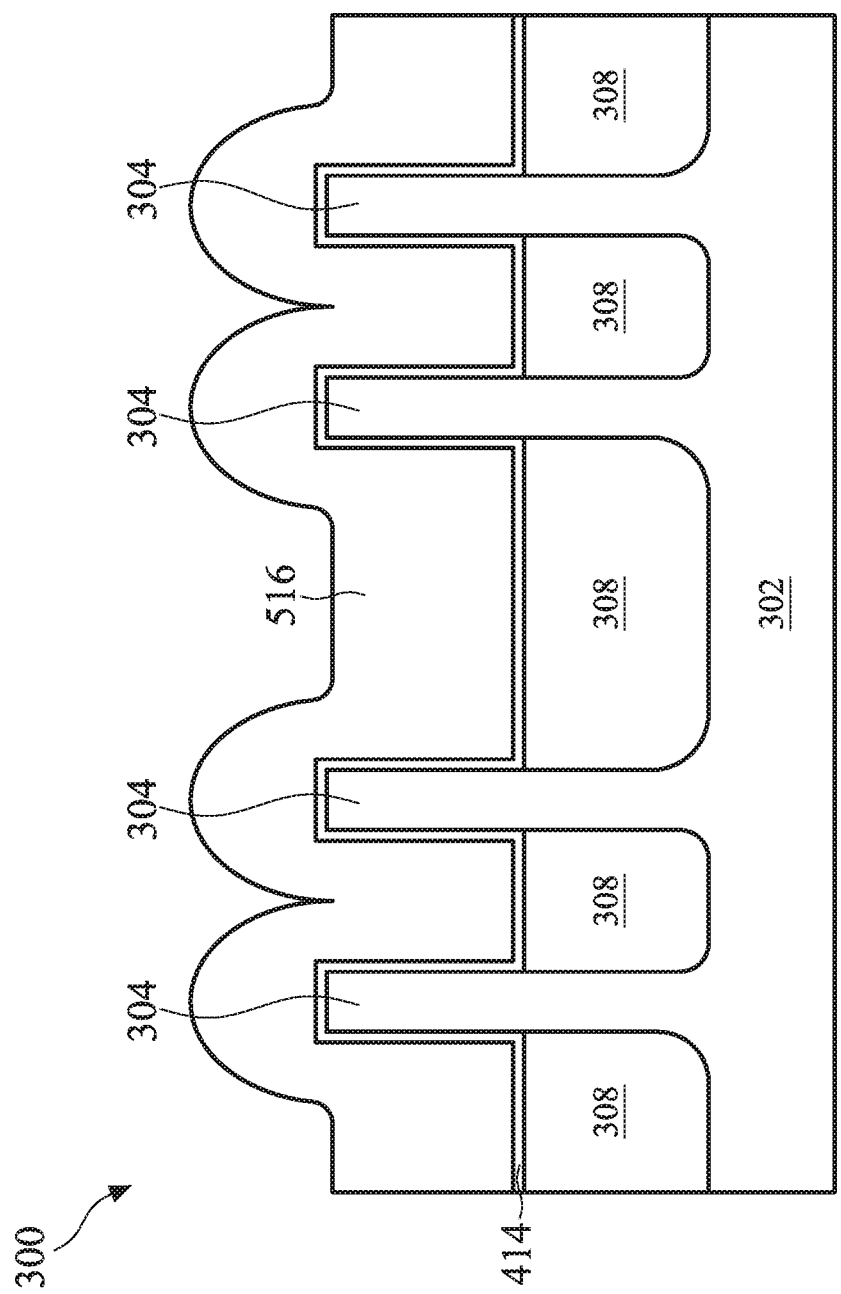

In some embodiments, after at least some of the trenches are filled and another cycle is not to be repeated at operation 208, the UV cure process 210 is performed. The UV cure process 210 may result in reducing or eliminating the seams and/or voids 518, as shown in FIG. 6. The UV cure process 210 may also result in reducing or eliminating bending of the fins 304. Generally, the UV cure process 210 may break Si—H bonds in the film 516 exposed to UV light during the UV cure process 210. The breaking of the Si—H bonds may result in dangling Si bonds in the film 516 and in the release of stress from the film 516. The release of stress from the film 516 can reduce or eliminate bending of the fins 304. The dangling Si bonds may then be restructured in the film 516 as Si—Si bonds, which can cause the film 516 to become denser and can eliminate or reduce the seams and/or voids 518.

The UV cure process 210 may include exposing the film 516 to UV light. In some examples, the UV cure process 210 may be performed in a different chamber than the film deposition processes 202, 206, and/or the etching process 204. In some examples, the film 516 is exposed to UV light using an H type bulb, also referred to as an "H bulb". An H bulb is a mercury vapor bulb that produces a mercury spectral output, which includes light wavelengths distributed across the UV range of the spectrum. In some examples, other bulb types may be used, such a Q bulb (indium spectral output), H+ bulb (mercury+spectral output), a V bulb (gallium spectral output), a D bulb (iron spectral output), or a combination thereof. In some examples, the UV light has a wavelength or a spectrum in a range from about 300 nm to about 400 nm. In some examples, the film 516 may be exposed to the UV light at a power in a range of 1 kilowatts (kW) to 9 kW. In some examples, the film 516 may be exposed to the UV light for duration equal to or less than about 30 min. In some examples, the UV cure process 210 may be performed in an ambient at a temperature in a range from 250 degrees Celsius to 450 degrees Celsius. Other processing conditions may be implemented for the UV cure process 210.

After the UV cure process 210, the dummy gate layer formation process 106 proceeds to a film deposition process 212. The film deposition process 212 can be performed in the reactor of the LPCVD. The film deposition process 212 can be identical to the film deposition processes 202, 206, as discussed above, or can be any other deposition process. The film deposition process 212 continues the deposition of the film 516 until the film 516 obtains a desired thickness. For example, the film deposition process 212 can continue until a lowest point of the upper surface of the film 516 is some thickness above a level of top surfaces of the fins 304, which thickness may be, for example, in a range from about 100 nm to about 300 nm.

Figure 7A:
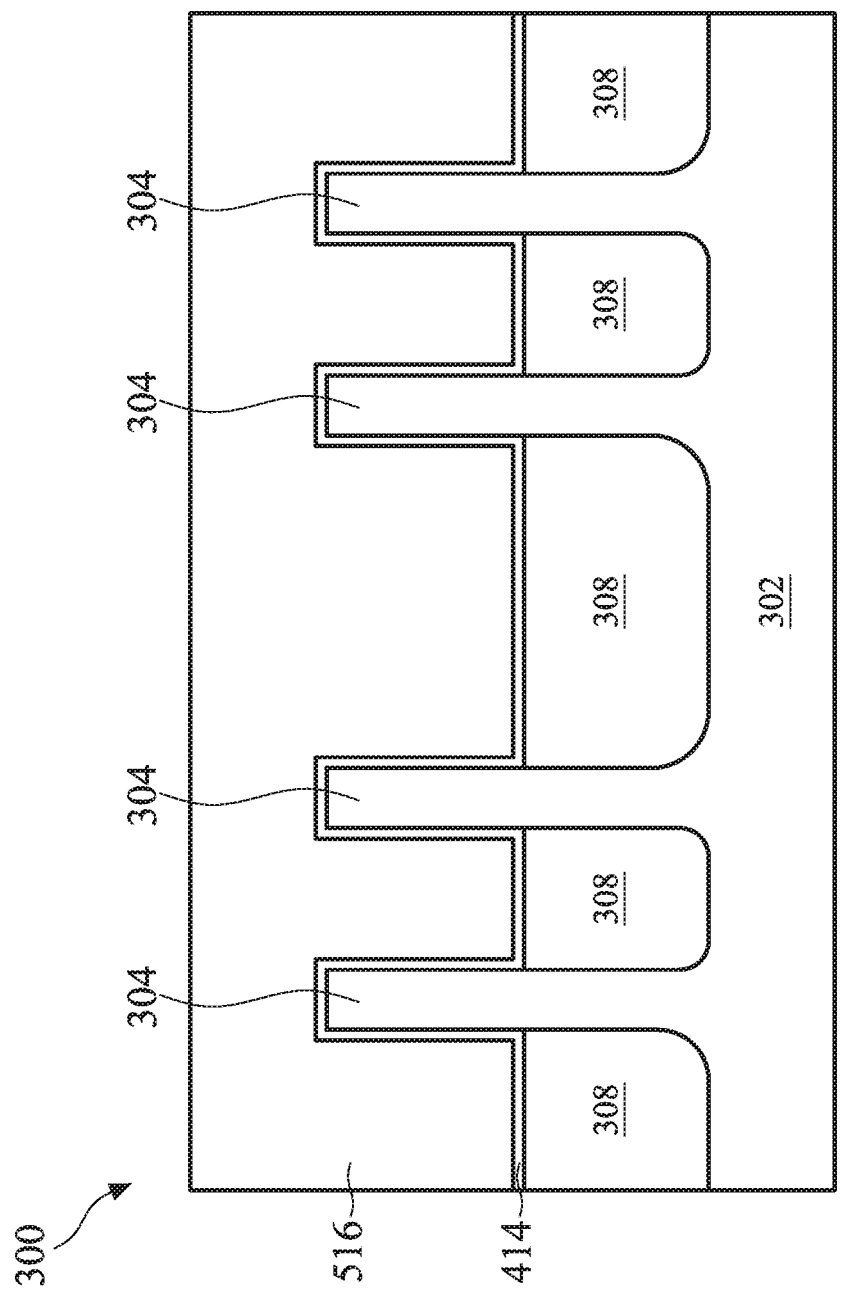

FIG. 7A illustrates the film 516 after the film deposition process 212 and subsequent planarization of the film 516. As shown, trenches 306 between neighboring fins 304 have been filled with substantially no seam or void (e.g., no seam and/or void has a dimension greater than 1 nm in the trenches 306) after a suitable number of cycles of the deposition-etch processes 204, 206, the UV cure process 210, and film deposition process 212. In some examples, such as illustrated, the film 516 is planarized, such as by a chemical mechanical planarization (CMP), to form a top surface of the film 516 to be planar.

Figure 7B:
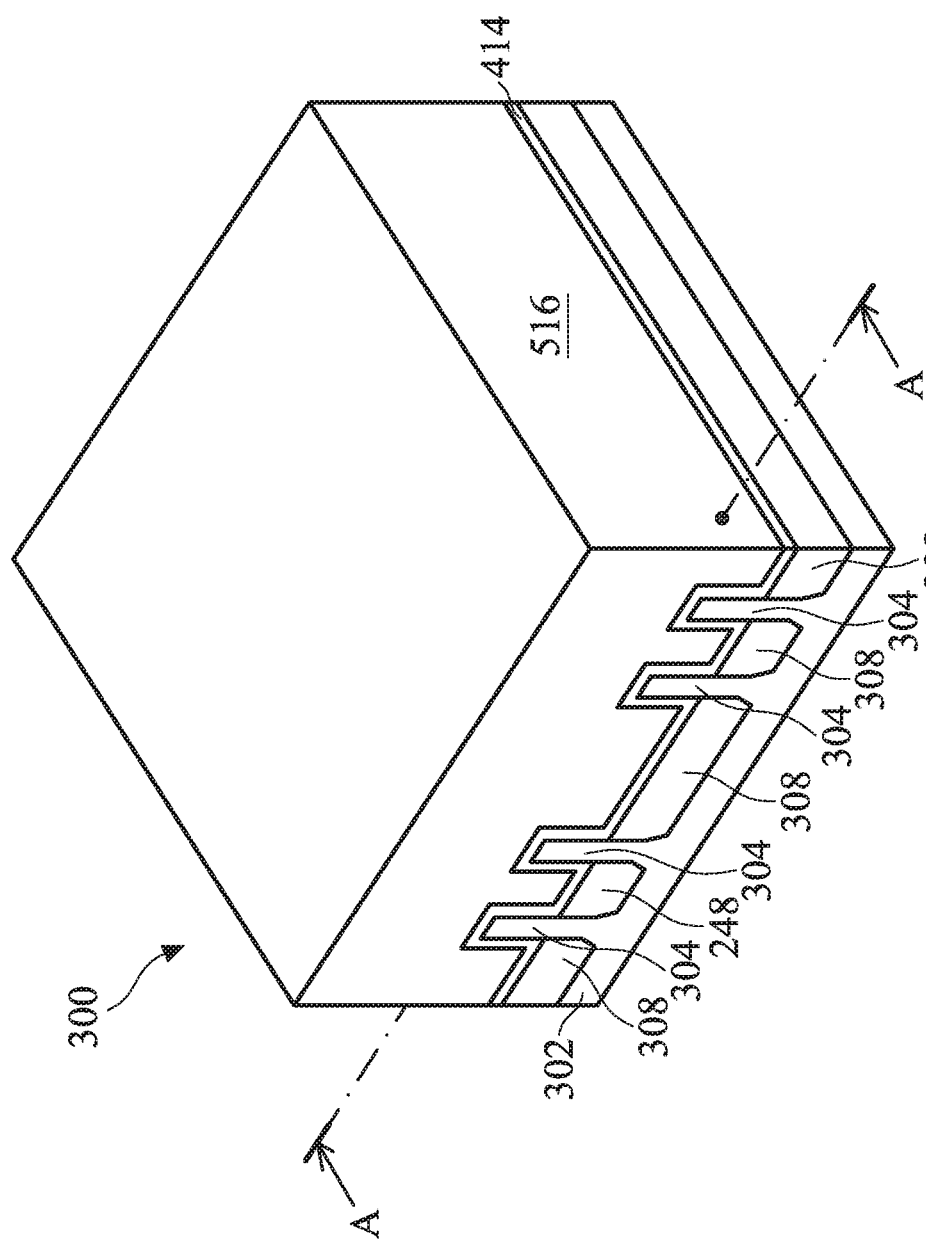

FIG. 7B illustrates a three-dimensional view of the semiconductor device structure 300 of FIG. 7A where the dummy gate layer (e.g., the film 516) has been formed over the substrate surface according to some embodiments. After the dummy gate layer 516 is formed and the trenches are filled, the flow chart 100 may proceed to operation 108, as will be discussed below in more detail.

Figure 8B:
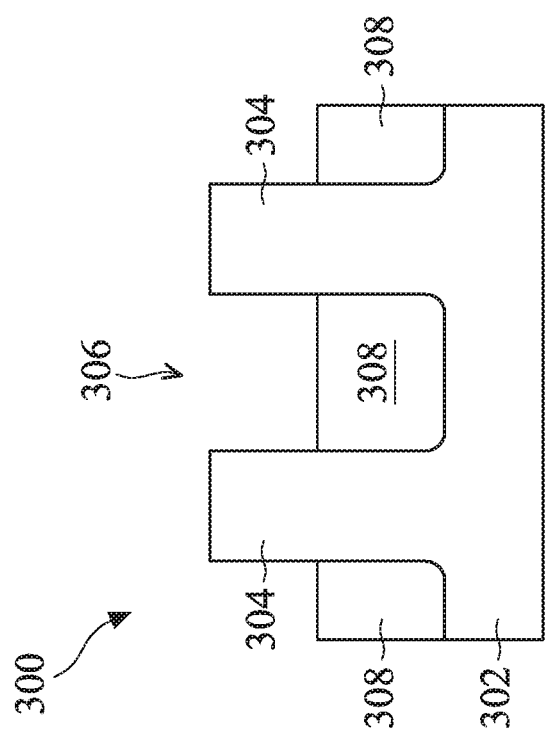
Figure 8A:
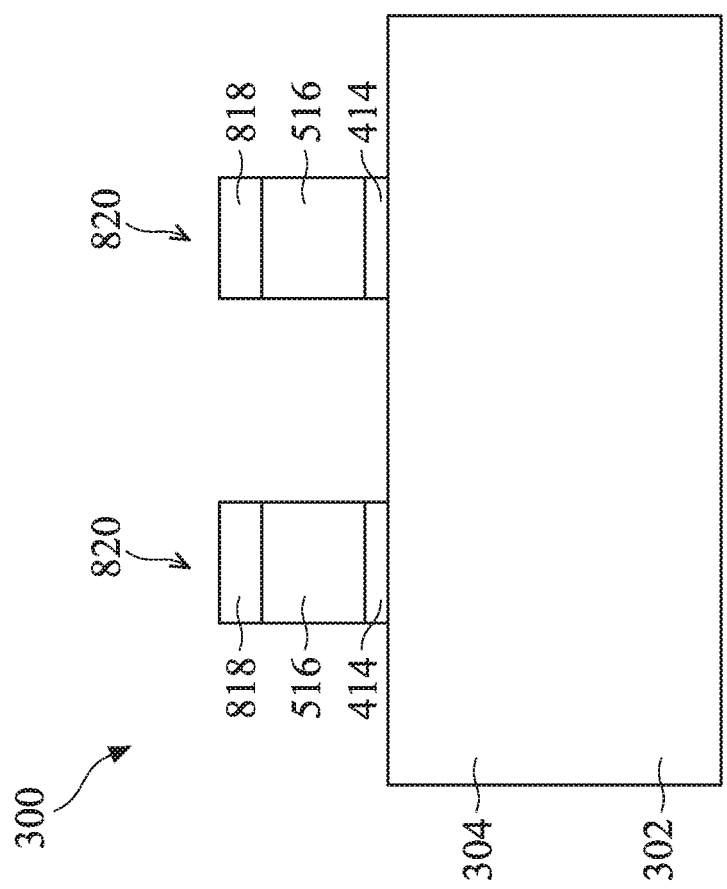
Figure 8C:
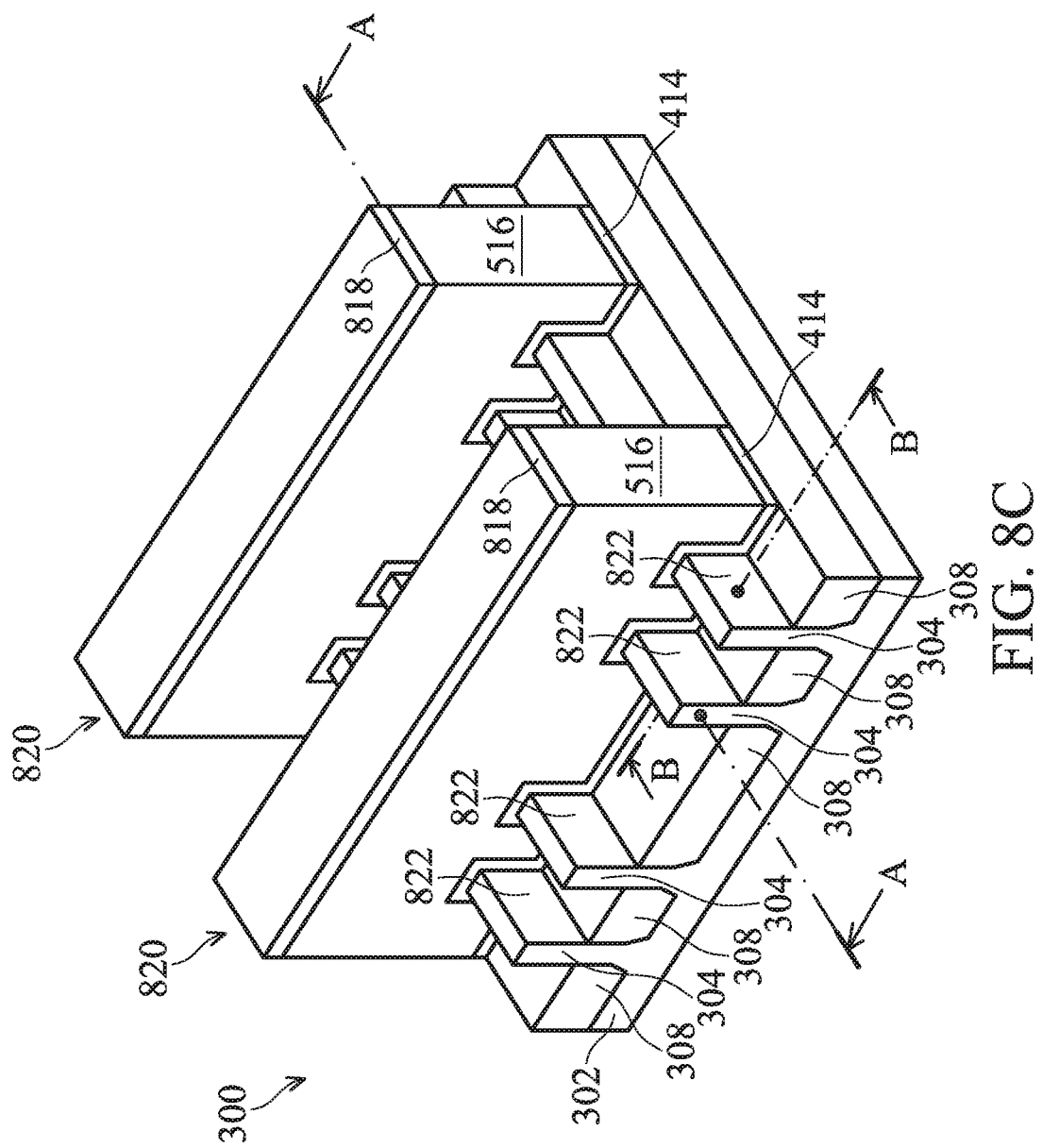

At operation 108, and with reference to FIGS. 8A, 8B, and 8C, a mask 818 is formed over the dummy gate layer 516, and the mask 818, dummy gate layer 516, and interfacial dielectric layer 414 (and seed layer if used) may then be patterned, for example, using photolithography and one or more etch processes to form the mask 818, dummy gate layer 516, and interfacial dielectric layer 414 for each dummy gate structure 820, as shown in FIGS. 8A and 8C. The mask 818 may include or be silicon nitride, silicon oxynitride, silicon carbon nitride, the like, or a combination thereof, deposited by CVD, physical vapor deposition (PVD), ALD, or any suitable deposition technique. Particularly, the dummy gate structures 820 are over and extend perpendicularly to the fins 304.

FIG. 8C further illustrates reference cross-sections. Cross-section A-A is in a plane along, e.g., channels in one fin 304 between opposing source/drain regions 822. Cross-section B-B is in a plane perpendicular to cross-section A-A and is across source/drain regions 822 in two neighboring fins 304. Cross-section B-B of FIG. 8C corresponds to a portion of the cross-section A-A of FIG. 3; a person having ordinary skill in the art will readily understand how processing of the cross-section B-B of FIG. 8C can be extrapolated to the cross-section A-A of FIG. 3. FIG. 8A and following figures ending with an "A" designation illustrate cross-sectional views at various instances of processing corresponding to cross-section A-A of FIG. 8C, and FIG. 8B and following figures ending with a "B" designation illustrate cross-section views at various instances of processing corresponding to cross-section B-B of FIG. 8C.

At operation 110, and with reference to FIGS. 9A and 9B, gate spacers 924 are formed along sidewalls of the dummy gate structures 820 (e.g., sidewalls of the interfacial dielectric layer 414, dummy gate layer 516, and mask 818) and over the fins 304. The gate spacers 924 may be formed by conformally depositing one or more layers for the gate spacers 924 and anisotropically etching the one or more layers, for example. The one or more layers for the gate spacers 924 may include a material different from the material(s) for the dummy gate structure 820. In some embodiments, the gate spacer 924 may include or be a dielectric material, such as silicon oxygen carbide, silicon nitride, silicon oxynitride, silicon carbon nitride, the like, multi-layers thereof, or a combination thereof, and may be deposited by any suitable deposition technique. An anisotropic etching process is then performed to remove portions of the layers to form the gate spacers 924, as depicted in FIGS. 9A and 9B.

If seams and/or voids 518 are not reduced or eliminated from the film 516 as described above, the patterning of the dummy gate layer 516 in operation 108, and illustrated in FIGS. 8A and 8C, could expose the seam and/or void 518 at a sidewall of the dummy gate structure. With the seam and/or void 518 exposed at the sidewall of the dummy gate structure, the one or more layers for the gate spacers 924 could be deposited in the seam and/or void 518, and therefore, the gate spacers 924 could be formed with a portion injected into the seam and/or void 518. This injected portion could cause defects in the removal of the dummy gate structure and/or in the formation of the replacement gate structure, as described subsequently. However, in some examples, the risk of a seam and/or void 518 being in the dummy gate layer 516 at the patterning of the dummy gate layer 516 can be reduced (e.g., by performing the UV cure process 210), which can reduce the risk of an injected portion of a gate spacer 924 being formed in the dummy gate layer 516.

In some examples, the dummy gate layer 516 is amorphous silicon, and the deposition of the one or more layers for the gate spacers 924 and/or the anisotropic etching process can be performed at temperatures that cause the amorphous silicon to crystallize into polycrystalline silicon (e.g., polysilicon). Hence, in subsequent processing, the dummy gate layer 516 may be polysilicon. With the dummy gate layer 516 being amorphous silicon at the initiation of the deposition of the one or more layers for the gate spacers 924, smooth sidewalls for the gate spacers (and subsequently formed replacement gate structure) may be achieved.

After the gate spacers 924 are formed, source/drain regions 822 may be formed in the fins 304, as depicted in FIGS. 9A and 9B. In some examples, recesses can be etched in the fins 304 using the dummy gate structures 820 and gate spacers 924 as masks (such that recesses are formed on opposing sides of the dummy gate structures 820), and a material may be epitaxially grown in the recesses to form the source/drain regions 822. Additionally or alternatively, the source/drain regions 822 may be formed by implanting dopants into the fins 304 and/or the epitaxial source/drain regions 822 using the dummy gate structures 820 as masks (such that the source/drain regions 822 are formed on opposing sides of the dummy gate structures 820).

Depending on the conductivity type of the transistor, the material for the source/drain regions 822 may be chosen to include or be silicon germanium, silicon carbide, silicon phosphorus, silicon carbon phosphorus, germanium, a III-V compound semiconductor, a II-VI compound semiconductor, or the like. The source/drain regions 822 may be raised with respect to the fins 304 and may have facets, which may correspond to crystalline planes of the semiconductor substrate 302.

An contact etch stop layer (CESL) 1026 and a first interlayer dielectric (ILD) 1028 are sequentially formed on surfaces of the source/drain regions 822, sidewalls and top surfaces of the gate spacers 924, top surfaces of the masks 818, and top surfaces of the isolation regions 308 using any suitable deposition technique. The CESL 1026 is deposited conformally and may include or be silicon nitride, silicon carbon nitride, silicon carbon oxide, carbon nitride, the like, or a combination thereof. The first ILD 1028 may include or be tetraethylorthosilicate (TEOS) oxide, silicon dioxide, a low-k dielectric material (e.g., a material having a dielectric constant lower than silicon dioxide), or another material. A CMP process may then be performed to planarize the first ILD 1028 and the CESL 1026 and to remove the masks 818 of the dummy gate structures 820, thereby leveling the top surface of the first ILD 1028 and CESL 1026 with the top surfaces of the dummy gate layers 516.

Figures 10A, 10B:
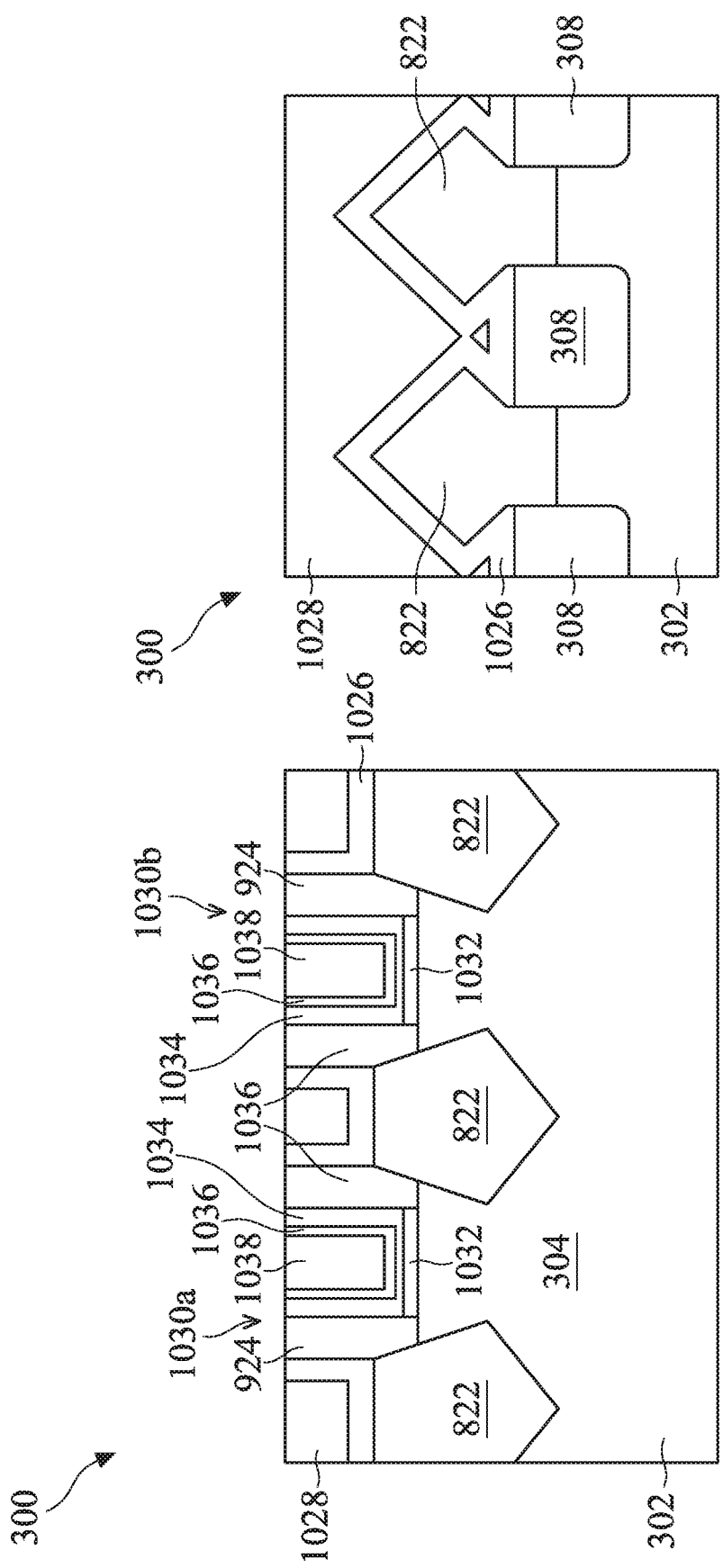

At operation 112, and with reference to FIGS. 10A and 10B, the dummy gate structures 820 are removed and replacement gate structures 1030a, 1030b are formed where the dummy gate structures 820 were removed. The dummy gate structures 820 can be removed using one or more etch processes. Upon removal of the dummy gate structures 820, recesses are formed between the gate spacers 924 where the dummy gate structures 820 are removed, and channel regions of the fins 304 are exposed through the recesses.

As described previously, an injected portion of a gate spacer 924 could be formed if a seam and/or void 518 is exposed in the dummy gate structure during the formation of the gate spacer 924. The injected portion could act as an etch stop and prevent removal of some of the dummy gate structure (e.g., such as underlying the injected portion). This could cause a defect in the subsequently formed replacement gate structure. In some examples, as described above, the risk of an injected portion of a gate spacer 924 in a dummy gate structure 820 can be reduced, which can reduce the risk of such an injected portion acting as an etch stop and causing a defect. Hence, yield in the manufactured device can be increased.

The replacement gate structures 1030a, 1030b are then formed in the recesses where the dummy gate structures 820 were removed. The replacement gate structures 1030a, 1030b each may include, as illustrated in FIG. 10A, an interfacial dielectric 1032, a gate dielectric layer 1034, one or more optional conformal layers 1036, and a gate conductive fill material 1038. The interfacial dielectric 1032 is formed on top surfaces of the fins 304 along the channel regions. The interfacial dielectric 1032 can be an oxide (e.g., silicon oxide) formed by thermal or chemical oxidation of the fin 304, and/or an oxide (e.g., silicon oxide), nitride (e.g., silicon nitride), and/or another dielectric layer using any suitable deposition technique.

The gate dielectric layer 1034 can be conformally deposited in the recesses where dummy gate structures 820 were removed (e.g., on the interfacial dielectric 1032, and sidewalls of the gate spacers 924) and on the top surfaces of the first ILD 1028, the CESL 1026, and gate spacers 924. The gate dielectric layer 1034 can be or include silicon oxide, silicon nitride, a high-k dielectric material, multilayers thereof, or other dielectric material. A high-k dielectric material may have a k value greater than about 4.0, and may include a metal oxide of or a metal silicate of hafnium (Hf), aluminum (Al), zirconium (Zr), lanthanum (La), magnesium (Mg), barium (Ba), titanium (Ti), lead (Pb), multilayers thereof, or a combination thereof.

The one or more optional conformal layers 1036 can include one or more barrier and/or capping layers and one or more work-function tuning layers. The one or more barrier and/or capping layers can include tantalum nitride, titanium nitride, the like, or a combination thereof. The one or more work-function tuning layer may include or be aluminum titanium carbide, aluminum titanium oxide, aluminum titanium nitride, the like, or a combination thereof. The materials for the one or more work-function tuning layer, the barrier layer and/or capping layer are selected so that a desired threshold voltage (Vt) is achieved for the transistor, which could be a p-type field effect transistor (pFET) or an n-type field effect transistor (nFET). A layer for the gate conductive fill material 1038 is formed over the one or more optional conformal layers 1036, if implemented, and/or the gate dielectric layer 1034. The layer for the gate conductive fill material 1038 can fill remaining recesses where the dummy gate structures 820 were removed. The layer for the gate conductive fill material 1038 may be or include a metal-containing material such as tungsten, cobalt, aluminum, ruthenium, copper, multi-layers thereof, a combination thereof, or the like.

A planarization process, like a CMP, may remove portions of the layer for the gate conductive fill material 1038, one or more optional conformal layers 1036, and gate dielectric layer 1034 above the top surfaces of the first ILD 1028, the CESL 1026, and gate spacers 924. The replacement gate structures 1030 including the gate conductive fill material 1038, one or more optional conformal layers 1036, gate dielectric layer 1034, and interfacial dielectric 1032 may therefore be formed as illustrated in FIG. 10A.

A second ILD 1140 is formed over the gate conductive fill material 1038, one or more optional conformal layers 1036, and gate dielectric layer 1034, first ILD 1028, gate spacers 924, and CESL 1026, as shown in FIGS. 11A and 11B. The second ILD 1140 may include or be silicon dioxide, a low-k dielectric material, silicon oxynitride, PSG, BSG, BPSG, USG, FSG, OSG, $SiO_xC_y$, Spin-On-Glass, Spin-On-Polymers, silicon carbon material, a compound thereof, a composite thereof, the like, or a combination thereof.

After the second ILD 1140 is formed, source/drain contact openings are formed through the second ILD 1140, the first ILD 1028, and the CESL 1026 to the source/drain regions 822 to expose at least portions of the source/drain regions 822. The second ILD 1140, the first ILD 1028, and the CESL 1026 may be patterned with the openings, for example, using photolithography and one or more etch processes, such as a dry etch or any suitable anisotropic etch process. The source/drain contact openings allow making electrical contact to the source/drain regions 822 for the transistors.

After the formation of the source/drain contact openings, conductive features are formed in the openings to the source/drain regions 822. The conductive features may include a silicide region 1142 formed on the source/drain regions 822, a barrier layer 1144, and a conductive material 1146 on the barrier layer 1144. The silicide region 1142 may be formed by thermally reacting an upper portion of the source/drain regions 822 with a metal layer (not shown), such as titanium, tantalum, or the like, formed on the source/drain regions 822. The barrier layer 1144 is conformally deposited in the source/drain contact openings on the silicide region 1142 and over the second ILD 1140, the first ILD 1028, and the CESL 1026, as shown in FIGS. 11A and 11B. The barrier layer 1144 may be or include titanium nitride, titanium oxide, tantalum nitride, tantalum oxide, any suitable transition metal nitrides or oxides, the like, or any combination thereof, and may be deposited by any suitable deposition technique. The conductive material 1146 may be or include cobalt, tungsten, copper, ruthenium, aluminum, gold, silver, alloys thereof, the like, or a combination thereof, and may be deposited by any suitable deposition technique. After the conductive material 1146 is deposited, excess conductive material 1146 and barrier layer 1144 may be removed by using a planarization process, such as a CMP. The planarization process may remove excess conductive material 1146 and barrier layer 1144 from above a top surface of the first ILD 1028. Hence, top surfaces of the conductive material 1146, the barrier layer 1144, and the first ILD 1028 may be coplanar. The conductive features may be referred to as contacts, plugs, etc.

Various embodiments described herein may offer several advantages. It will be understood that not all advantages have been necessarily described herein, no particular advantage is required for any embodiment, and other embodiments may offer different advantages. As an example, embodiments described herein include improved gate formation methods for forming a dummy gate layer (e.g., a-Si) in high aspect ratio trenches using a cyclic deposition-etch process with a post UV cure process. The UV cure process can break bonds in the silicon film and can cause the film to reform with reduced voids, seams, and fin bending. Additionally, by reducing or eliminating voids and/or seams, risk of defects in replacement gate structures can be reduced.

In an embodiment, a method for semiconductor processing is provided. The method includes performing a first deposition process to form a conformal film over a bottom surface and along sidewall surfaces of a feature on a substrate. The method includes performing an etch process to remove a portion of the conformal film. The method includes repeating the first deposition process and the etch process to fill the feature with the conformal film. The method includes exposing the conformal film to ultraviolet light.

In another embodiment, the method includes forming fins on a substrate. Sidewalls of the fins and a bottom surface between the sidewalls of the fins define a trench therebetween. The method includes forming a gate layer in the trench and over the fins. Forming the gate layer includes depositing at least a portion of the gate layer in the trench by performing a cyclic deposition-etch process. The at least the portion of the gate layer merges by lateral growth from the sidewalls of the fins. Forming the gate layer includes exposing the at least the portion of the gate layer to ultraviolet light. The method includes, after forming the gate layer, patterning the gate layer to form a gate structure over the fins.

In yet another embodiment, the method includes forming fins on a substrate. Sidewalls of the fins and a bottom surface define a trench therebetween. The method includes forming a dummy gate structure over the fins. Forming the dummy gate structure includes performing a cyclic deposition-etch process to deposit a first film over the fins. The first film includes a portion of a dummy gate layer. Forming the dummy gate structure includes performing an ultraviolet (UV) curing process to expose the first film to ultraviolet light. Forming the dummy gate structure includes performing a deposition process to deposit a second film over the first film. The second film includes a remaining portion of the dummy gate layer. The method includes removing the dummy gate structure to form an opening. The method includes forming a replacement gate structure over the fins in the opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for semiconductor processing, the method comprising:
    performing a first deposition process to form a layer of a first material in a trench, the trench being between a first structure and a second structure;
    performing an etch process to remove a portion of the first material along an upper portion of sidewall surfaces of the trench;
    repeating the first deposition process and the etch process one or more times, wherein the trench is filled after repeating the first deposition process and the etch process one or more times;
    curing the first material; and
    after curing the first material, performing a second deposition process to form the first material to a first depth above an upper surface of the first structure and the second structure.

2. The method of claim 1, wherein curing comprises a UV curing process.

3. The method of claim 2, wherein the curing is performed at an ambient temperature of about 250° C. to about 450° C.

4. The method of claim 1, wherein the first deposition process comprises a low-pressure chemical vapor deposition (LPCVD) process.

5. The method of claim 4, wherein a temperature of the LPCVD process is in a range from about 120° C. to about 550° C.

6. The method of claim 5, wherein a silicon-containing precursor of the LPCVD process comprises $SiH_4$, $Si_2H_6$, $Si_2H_2Cl_2$, $SiHCl_3$, $Si_2Cl_6$, or a combination thereof.

7. The method of claim 6, wherein a flow rate of the silicon-containing precursor is less than or equal to about 2 standard liters per minute (sLm).

8. The method of claim 7, wherein a pressure of the LPCVD process is less than or equal to about 1 Torr.

9. A method for semiconductor processing, the method comprising:
   forming fins on a substrate, sidewalls of the fins and a bottom surface between the sidewalls of the fins defining a trench therebetween;
   forming a semiconductor layer in the trench and over the fins, forming the semiconductor layer comprising:
      performing a plurality of first deposition cycles and a plurality of etch cycles, each of the first deposition cycles being followed by an etch cycle of the plurality of etch cycles;
      after performing the plurality of first deposition cycles and the plurality of etch cycles, curing the semiconductor layer; and
      after curing, performing a second deposition cycle.

10. The method of claim 9, wherein the trench is completely filled prior to performing the second deposition cycle.

11. The method of claim 9, wherein the plurality of first deposition cycles and the plurality of etch cycles are performed in a same process chamber, and further comprising performing a purge between each of the first deposition cycles and the following etch cycle.

12. The method of claim 11, wherein at least some of the plurality of etch cycles removes at least some of the semiconductor layer from an upper sidewall of the trench.

13. The method of claim 9, wherein each of the plurality of first deposition cycles deposits a layer having a thickness in a range from about 10 Angstroms to about 100 Angstroms.

14. The method of claim 9, wherein after performing the second deposition cycle, the semiconductor layer has a thickness above the fins in a range from about 100 nm to about 300 nm.

15. The method of claim 9, wherein curing removes one or more voids in the semiconductor layer.

16. The method of claim 9 further comprising forming a dielectric layer along sidewalls and a bottom of the trench prior to forming the semiconductor layer.

17. A method for semiconductor processing, the method comprising:
   forming a trench interposed between a first fin and a second fin;
   forming a semiconductor layer over the first fin and the second fin, wherein forming the semiconductor layer comprises:
      performing a first deposition process to form a layer of a first material in the trench;
      performing an etch process to remove a portion of the first material in the trench;
      repeating the first deposition process and the etch process one or more times;
      curing the first material to reduce a number of voids in the first material; and
      after curing the first material, performing a second deposition process to form another layer of the first material.

18. The method of claim 17, wherein the curing is an ultraviolet curing process.

19. The method of claim 18, wherein the curing is performed at an ambient temperature of about 250° C. to about 450° C.

20. The method of claim 17, wherein trench is completely filled with the first material prior to curing.

* * * * *